(12) United States Patent
Cress et al.

(10) Patent No.: US 7,771,194 B2
(45) Date of Patent: Aug. 10, 2010

(54) GAS PREHEATER FOR CHEMICAL VAPOR PROCESSING FURNACE HAVING CIRCUITOUS PASSAGES

(75) Inventors: James Jay Cress, Mishawaka, IN (US); Brian J. Miller, Mishawaka, IN (US)

(73) Assignee: Honeywell International Inc., Morristown, NJ (US)

( * ) Notice: Subject to any disclaimer, the term of this patent is extended or adjusted under 35 U.S.C. 154(b) by 1111 days.

(21) Appl. No.: 11/441,208

(22) Filed: May 26, 2006

(65) Prior Publication Data
US 2007/0275339 A1 Nov. 29, 2007

(51) Int. Cl.
*F28F 27/02* (2006.01)
(52) U.S. Cl. .................. 432/212; 432/219; 432/224; 165/102; 165/139
(58) Field of Classification Search .............. 432/212, 432/219, 223, 224, 225; 165/102, 139; 427/248.1, 427/249.2, 249.3; 96/4; 95/289
See application file for complete search history.

(56) References Cited

U.S. PATENT DOCUMENTS

| | | | | |
|---|---|---|---|---|
| 5,480,678 A | * | 1/1996 | Rudolph et al. | ......... 427/248.1 |
| 5,900,297 A | * | 5/1999 | Rudolph et al. | ........... 428/66.2 |
| 6,109,209 A | * | 8/2000 | Rudolph et al. | ............ 118/724 |
| 6,162,298 A | | 12/2000 | Rudolph | |
| 6,206,972 B1 | | 3/2001 | Dunham | |
| 6,572,371 B1 | * | 6/2003 | Sion et al. | .................. 432/247 |
| 6,616,766 B2 | | 9/2003 | Dunham | |
| 6,626,998 B1 | | 9/2003 | Dunham | |
| 6,669,988 B2 | | 12/2003 | Daws et al. | |
| 6,758,909 B2 | | 7/2004 | Jonnalagadda et al. | |
| 6,846,514 B2 | | 1/2005 | Jonnalagadda et al. | |
| 6,942,753 B2 | | 9/2005 | Choi et al. | |
| 6,953,605 B2 | | 10/2005 | Sion et al. | |
| 2004/0047990 A1 | | 3/2004 | Daws et al. | |
| 2005/0223986 A1 | | 10/2005 | Choi et al. | |
| 2005/0251990 A1 | | 11/2005 | Choi et al. | |
| 2008/0236495 A1 | * | 10/2008 | Tompa | ........................ 118/724 |
| 2009/0178616 A1 | * | 7/2009 | Byun | ......................... 118/715 |

* cited by examiner

*Primary Examiner*—Gregory A Wilson
(74) *Attorney, Agent, or Firm*—Birch, Stewart, Kolasch, & Birch, LLP.

(57) ABSTRACT

A gas preheater (10) includes an entrance plate (12) having a first side (14), a second side (16), at least one opening (18) connecting the first side (14) and the second side (16), and a plurality of walls (19) on the second side (16) having tops (21) spaced from the second side (16), the walls (19) defining at least one circuitous pathway (22e, 22f, 22g, 22h) on the second side (16) beginning at the at least one opening (18), and a diffuser plate (40) having a first side and a second side and a plurality of holes (42) between the first side and the second side, the diffuser plate first side defining with the entrance plate second side (16) and the plurality of walls (19) at least one circuitous passage along the at least one circuitous pathway (22e, 22f, 22g, 22h), the at least one circuitous pathway having a first portion (22e1) leading from the at least one opening (18) and a second portion (22e2) spaced from the at least one opening (18), wherein the holes (42) in the diffuser plate (40) overlie the circuitous passage second portion (22e2).

19 Claims, 5 Drawing Sheets

GAS PREHEATER FOR CHEMICAL VAPOR PROCESSING FURNACE HAVING CIRCUITOUS PASSAGES

FIELD OF THE INVENTION

The present invention is directed toward a gas preheater for a chemical vapor processing furnace, and, more specifically, toward a gas preheater having at least one circuitous pathway in an interior through which process gas passes before exiting into a furnace.

BACKGROUND OF THE INVENTION

Furnaces for carrying out chemical vapor deposition (CVD) and/or chemical vapor infiltration (CVI) are well known and are discussed for example, in U.S. Pat. No. 6,162,298 to Rudolph, the entire contents of which is hereby incorporated by reference. In such furnaces, process gas is introduced into a lower portion of a furnace where it passes through a gas preheating system and is heated before it enters the processing portion of the furnace.

Conventional gas preheating systems generally occupy a relatively large part of the lower portion of a furnace and reduce the amount of space in the furnace for holding materials to be processed. If the thickness of such conventional preheaters is reduced, however, gases may not be heated and mixed to an adequate degree before entering the furnace. The thickness of the preheating system therefore represents a tradeoff between the amount of usable space inside the furnace taken up by the preheating system and the ability of the preheating system to adequately preheat and distribute the gas before it is released into the furnace.

In addition, products to be processed in a CVD or CVI furnace are often placed or stacked on a pallet or other support for ease of handling, and this pallet with the products loaded thereon is then placed into the furnace. The height of the pallet further reduces the space available for products in the furnace.

It would therefore be desirable to provide a gas preheating system for a CVD/CVI furnace that preheats and distributes process gases in a satisfactory manner while taking up less space in a furnace than conventional gas preheaters, and, optionally, that can be used as a support or pallet for transferring work pieces to and from a furnace.

SUMMARY OF THE INVENTION

These problems and others are addressed by the present invention which comprises a gas preheater that has, as a first feature, an entrance plate having a first side, a second side, and at least one opening connecting the first side and the second side and a plurality of walls on the second side having tops spaced from the second side, the walls defining at least one circuitous pathway on the second side beginning at the at least one opening. A further feature of the preheater is a diffuser plate having a first side and a second side and a plurality of holes between the first side and the second side which defines, with the entrance plate second side and the plurality of walls, at least one circuitous passage along the at least one circuitous pathway. The at least one circuitous passage has a first portion leading from the at least one opening and a second portion spaced from the at least one opening, and the holes in the diffuser plate overlie the circuitous passage second portion.

Another aspect of the invention is a gas preheater that includes an entrance plate comprising first, second, third and fourth entrance plate portions, each of the entrance plate portions having a first side, a second side, an opening connecting the first side and the second side, and a plurality of walls on the second side having tops spaced from the second side and defining at least one circuitous pathway on the second side beginning at the opening. The preheater also includes a diffuser plate having a first side and a second side and a plurality of holes between the first side and the second side resting on the tops of the walls. The diffuser plate first side defines, with the entrance plate portion second sides and the walls, a plurality of circuitous passages leading from the openings in the first, second, third and fourth entrance plate portions. The diffuser plate holes overlie predetermined portions of the circuitous passageways, and the location of the holes is selected to provide a predetermined minimum travel distance between the entrance plate portion openings and the diffuser plate holes.

An additional aspect of the invention is a gas preheater that includes an entrance plate comprising first, second, third and fourth entrance plate portions where each of the entrance plate portions has a first side, a second side, an opening connecting the first side and the second side, and a plurality of walls on the second side having tops spaced from the second side. The walls define at least two circuitous pathways having serpentine portions on the second side beginning at the opening. The preheater also includes a diffuser plate having a first side resting on the walls and a second side and a plurality of holes between the first side and the second side, the diffuser plate first side defining with the entrance plate portion second sides and the walls a plurality of circuitous passages leading from the openings in the first, second, third and fourth entrance plate portions. The diffuser plate holes overlying predetermined portions of the circuitous passageways, and the location of the holes is selected to provide a predetermined minimum travel distance between the entrance plate portion openings and the diffuser plate holes. A plurality of blocking plates rest on the diffuser plate second side and at least partially cover some of the holes. An exit plate having a plurality of holes is supported above the diffuser plate.

BRIEF DESCRIPTION OF THE DRAWINGS

These and other aspects and features of the invention will become apparent from a reading of the following detailed description together with the accompanying drawings wherein.

DETAILED DESCRIPTION

Figure 1:
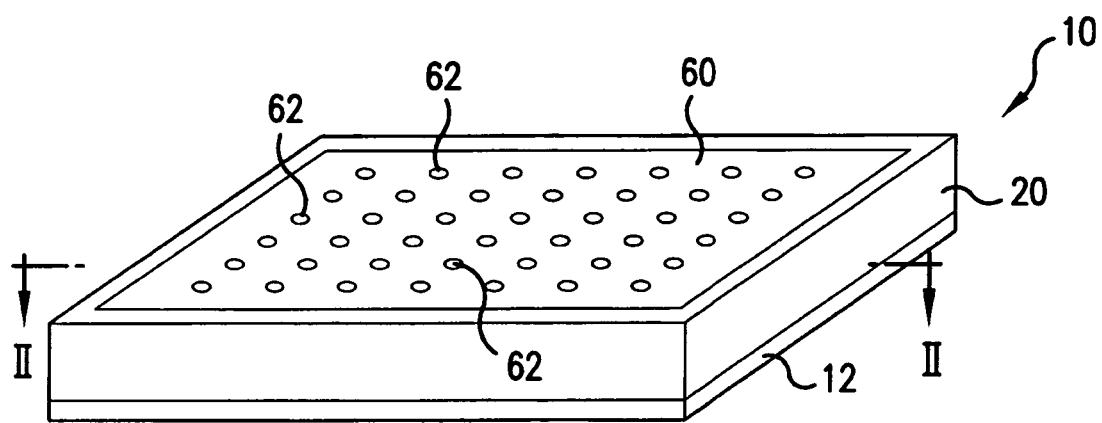
FIG. 1 is a perspective view of a gas preheater according to a first embodiment of the present invention.
Figure 2:
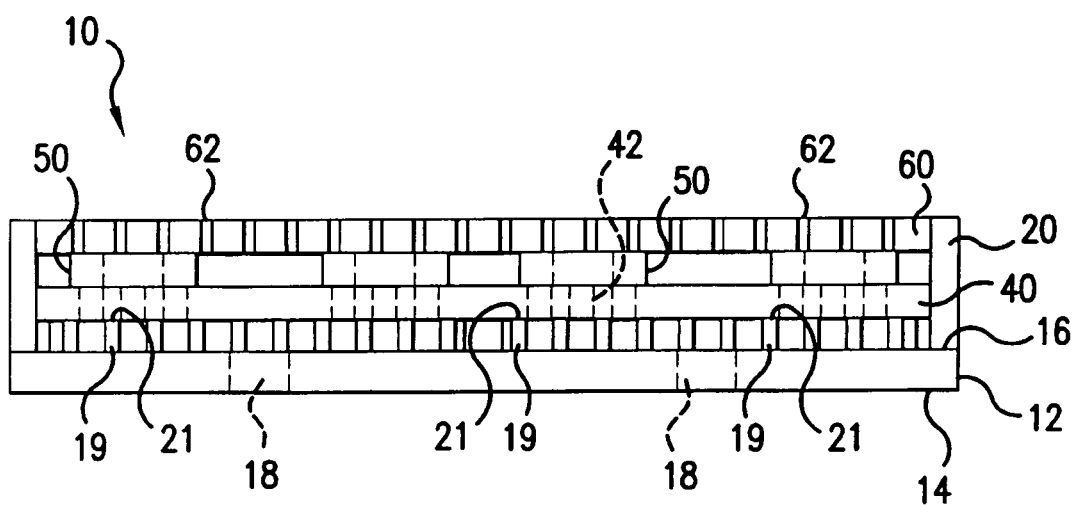
FIG. 2 is a sectional elevational view taken along line II-II in FIG. 1.

Referring now to the drawings, wherein the showings are for purposes of illustrating preferred embodiments of the present invention only and not for the purpose of limiting same, FIGS. 1 and 2 illustrate a gas preheater 10 comprising an entrance plate 12 having a first side 14, a second side 16 and a plurality of entrance openings 18 connecting first side 14 and second side 16 to allow gas from an outlet (not shown)

in the floor of a furnace (not shown) to enter gas preheater 10. A sidewall frame 20 is supported on the periphery of second side 16 of entrance plate 12 but may alternately be formed integrally with entrance plate 12. A plurality of raised walls 19 having tops 21 define pathways on the entrance plate 12 as discussed below. Second side 16 of entrance plate 12 and the pathways thereon are illustrated in FIG. 3.

Figure 3:
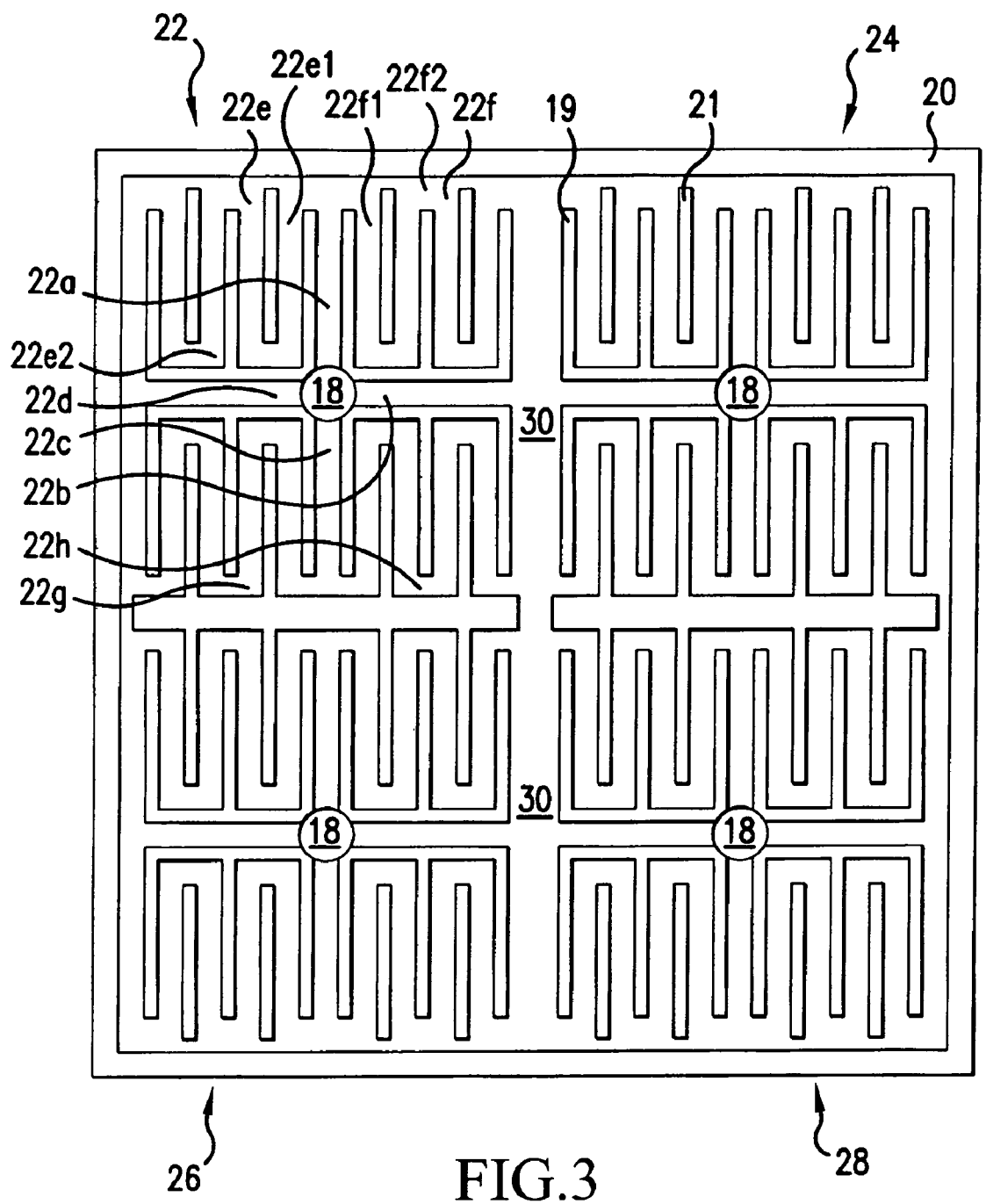
FIG. 3 is a perspective view of an entrance plate forming a first layer of the gas preheater of FIG. 1.

With reference to FIG. 3, entrance plate 12 includes four entrance plate portions, a first entrance plate portion 22, a second entrance plate portion 24, a third entrance plate portion 26 and a fourth entrance plate portion 28. The entrance plate portions may comprise various portions of a single-piece entrance plate 12, or alternately, the first through fourth entrance plate portions 22, 24, 26, 28 may comprise individual elements joined or held together to form entrance plate 12. Moreover, an entrance plate may have a greater or lesser number of entrance plate portions, the number of entrance plate portions depending, for example, on the geometry of the furnace in which the gas preheater is used and on the location of gas inlets in the floor of the furnace. Each entrance plate portion has four linear paths leading from the opening 18 on that entrance plate section. First entrance plate portion 22 is discussed below; the second third and fourth entrance plate portions 22 are similarly configured.

First entrance plate portion 22 includes a first linear path 22a, a second linear path 22b, a third linear path 22c and a fourth linear path 22d disposed at 90 degree angles to one another and leading away from the opening 18 in entrance plate portion 22. First and second circuitous paths 22e and 22f lead away from the end of first linear path 22a while third and fourth circuitous paths 22g and 22h lead away from the end of third linear path 22c. First circuitous path 22e and third circuitous path 22g extend along an inner portion of sidewall 20 and join with fourth linear path 22d; second circuitous path 22f and fourth circuitous path 22h terminate at a central space 30 which extends between portions of sidewall 20 on opposite sides of the entrance plate and which allows fluid communication among the paths of all four entrance plate portions. Second linear path 22b of first entrance plate portion 22 also terminates at central space 30. While first linear path 22a and third linear path 22c have been separately identified for purposes of description, they can also be considered to be part of one of the circuitous paths to which they connect.

In a preferred embodiment, as illustrated in the drawings, the circuitous passages are passages which have multiple turns and that double back on themselves at least once in a serpentine manner. The passages may include linear sections, but could also be formed without linear sections. The passages could also be formed in other shapes and still be considered to be circuitous so long as they change the direction of gas flow by at least about 180 degrees between the gas entrance and the gas exit to keep the gas in contact with the surfaces of the preheater for a sufficiently long period to absorb an adequate amount of heat.

Figure 4:
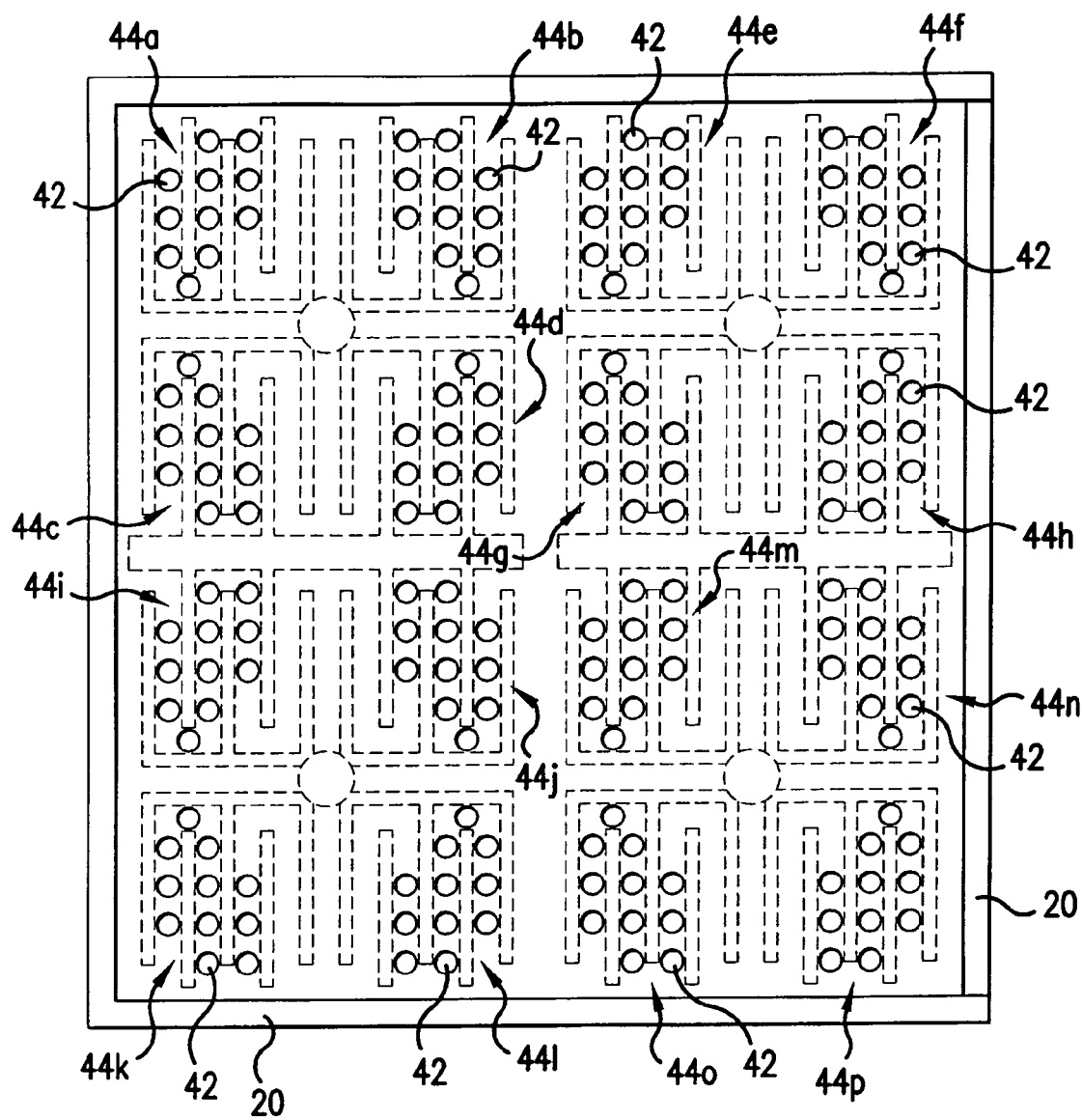
FIG. 4 is a top plan view of a distributor plate mounted on the entrance plate of FIG. 1.

Diffuser plate 40, illustrated in FIG. 4, rests on the tops 21 of walls 19 and, with the walls 19 and entrance plate second side 16 defines a plurality of fluid flow passages that generally follow the pathways defined by walls 19. Small gaps may exist between diffuser plate 40 and walls 19; however, diffuser plate 40 and walls 19 are configured so that the majority of gas traveling along the passages between the entrance plate 12 and the diffuser plate 40 will follow the circuitous pathways.

Diffuser plate 40 includes a plurality of holes 42 arranged in groups 44a-44p which holes 42 overlie selected portions of the fluid flow passages defined by walls 19 on entrance plate 12. For example, a first group 44a of holes overlies circuitous pathway 22e of first entrance plate portion 22, a second group of holes 44b overlies second circuitous pathway 22f of plate portion 22, a third group of holes 44c overlies third circuitous pathway 22g of first plate portion 22 and a fourth group of holes 44d overlies fourth circuitous pathway 22h of first entrance plate portion 22. Fifth through eighth groups of holes 44e, 44f, 44g and 44h overlie corresponding portions of second entrance plate portion 24, ninth through twelfth groups of holes 44i-44L overlie corresponding portions of third entrance plate portion 26 and thirteenth through sixteenth groups of holes 44m-44p overlie corresponding portions of fourth entrance plate portion 28 as illustrated in FIG. 4.

As will be appreciated from FIG. 4, first portions of each of the circuitous paths, such as first portion 22e1 of first circuitous path 22e of first entrance plate portion 22, do no lie under holes 42; all diffuser plate openings 42 are located over the second portion 22e2 of first circuitous path 22e. In this manner, gas exiting opening 18 in first entrance plate portion 22 must travel a predetermined minimum distance to the second portion 22e2 of the flow path 22e before passing through diffuser plate 40.

Figure 5:
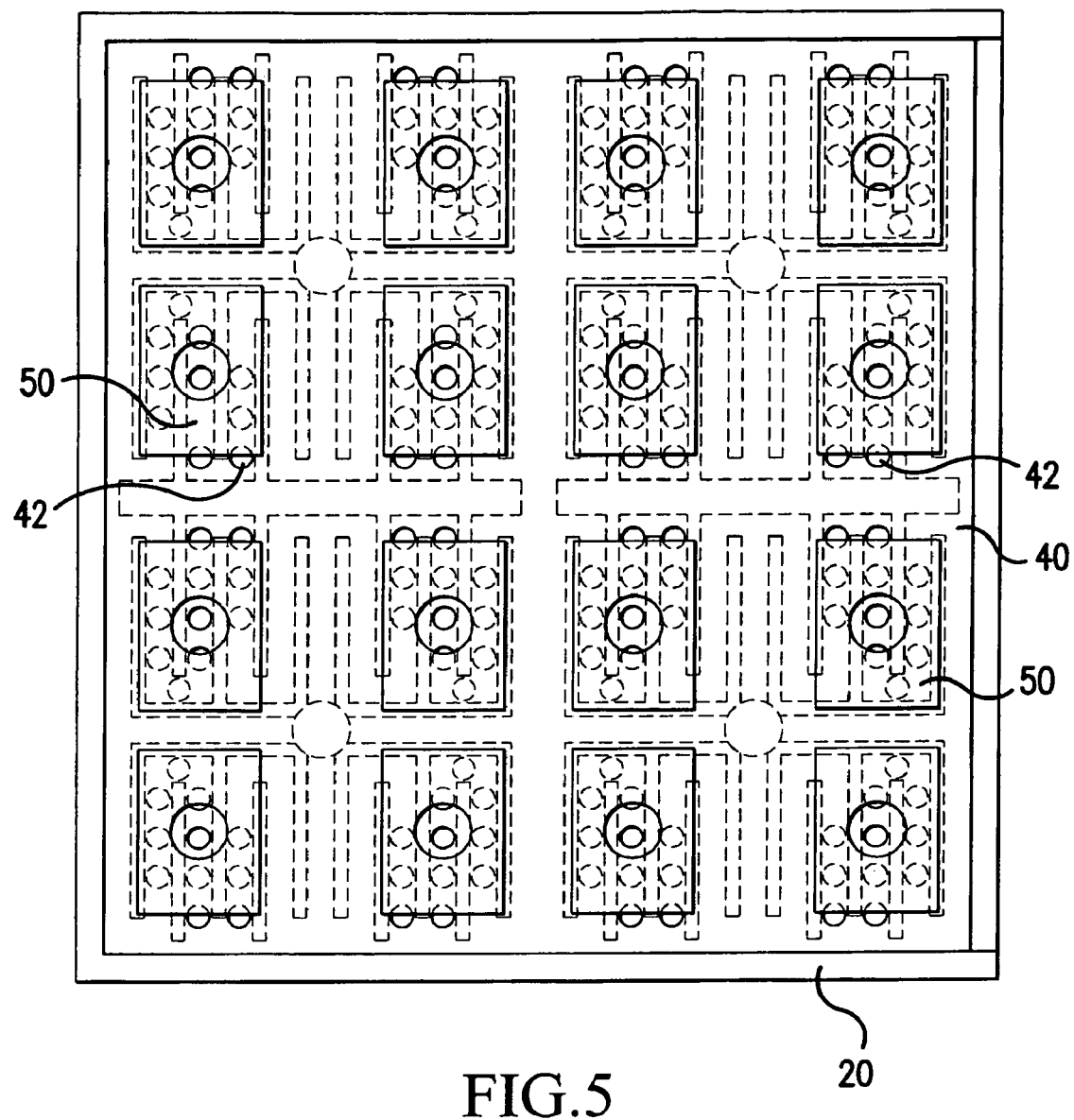
FIG. 5 is a top plan view of a plurality of blocking plates supported by the distributor plate of FIG. 4.

With reference to FIG. 5, a plurality of blocking plates 50 may be positioned on diffuser plate 40 to block some portion of holes 42 to control gas flow and preheating. The use of blocking plates 50 allows the same diffuser plate to be used in different environments where different flow rates and/or degrees of preheating are required. A greater or lesser number of blocking plates can be provided, and the position of the blocking plates 50 can be varied to control the total area of holes in diffuser plate 40 available for gas to flow through.

An exit plate 60 is supported by blocking plates 50 or, alternately, may be supported by the top edge of sidewall 20. Exit plate 60 includes a plurality of exit openings 62 through which gas flows from the interior of preheater 10 into a furnace (not shown). Exit plate 60 is also strong enough that products may be stacked on exit plate 60 while the preheater 10 is outside a furnace and so that the preheater and stacked products can be inserted into a processing furnace together.

In use, products (not shown) are stacked on exit plate 60 of preheater 10, and the stacked products are placed in a processing furnace so entrance plate first side 14 rests on the floor or other support in the furnace with openings 18 aligned with furnace gas outlets. Preheater 10 is heated as the furnace is heated and is at substantially the same temperature as the furnace when process gases begin to flow into the preheater through openings 18. Gas entering preheater 10 through opening 18 in first entrance plate portion 22, for example, will travel along each of first, second, third and fourth linear flow paths 22a, 22b, 22c and 22d, and absorb heat from the walls 19, entrance plate 12 and diffuser plate 40 as it travels. A gas flow traveling along first linear path 22a will split, and a first portion will enter first portion 22e1 of first circuitous path 22e and a second portion will enter first portion 22f1 of second circuitous path 22f. The gas flowing along first circuitous path 22e will reach the second portion 22e2 of the first circuitous path 22e where it will be released through holes 42 in diffuser plate 40 that are not blocked by blocking plates 50. The gas will continue to absorb heat from the blocking plates 50 and the exit plate 60 as it travels from the diffuser plate to openings 62 in exit plate 60. Gas entering openings 18 in second through fourth entrance plate portions 24, 26 and 28 follows a similar path and absorbs heat in a similar manner.

Fourth linear path 22d directs gas against the inner side of sidewall 20, and some of this gas may also reach group 44a of holes 42 in the diffuser plate. The gas traveling along second circuitous path 22f may likewise reach second portion 22f2 of second circuitous path 22f and pass through group 44b of openings 42 in the diffuser plate. Gas that does not exit through holes 42 may pass to center space 30 of entrance plate 12. Gas that travels along second linear path 22b also reaches center space 30 from where it may travel to second portion 22f2 of second circuitous path 22f or to one of circuitous pathways of second, third and fourth entrance plate portions 24, 26, 28, respectively. In this manner, a substantial portion of gas that enters through the opening 18 in a given one of the entrance plate portions 22, 24, 26, 28 will exit through diffuser plate holes 18 above that entrance plate portion. However, the flow paths of at least some of the entrance plate portions are in fluid communication so that gas from one entrance plate portion can reach other entrance plate portions and exit through the diffuser plate openings 42 above the other entrance plate portions. This may help correct imbalances that may occur if for example, the same amount of gas does not flow into all openings 18 in entrance plate 12 or if more openings 42 in diffuser plate 40 are blocked in one section of the preheater than in another. However, substantially all gas passing through entrance plate holes 18 will travel a predetermined minimum distance through the linear portions of the pathways and through the first portions of the circuitous pathways before passing though the holes 42 in diffuser plate 40 to help provide for a heating of substantially all gas to a certain minimum degree.

Figure 6:
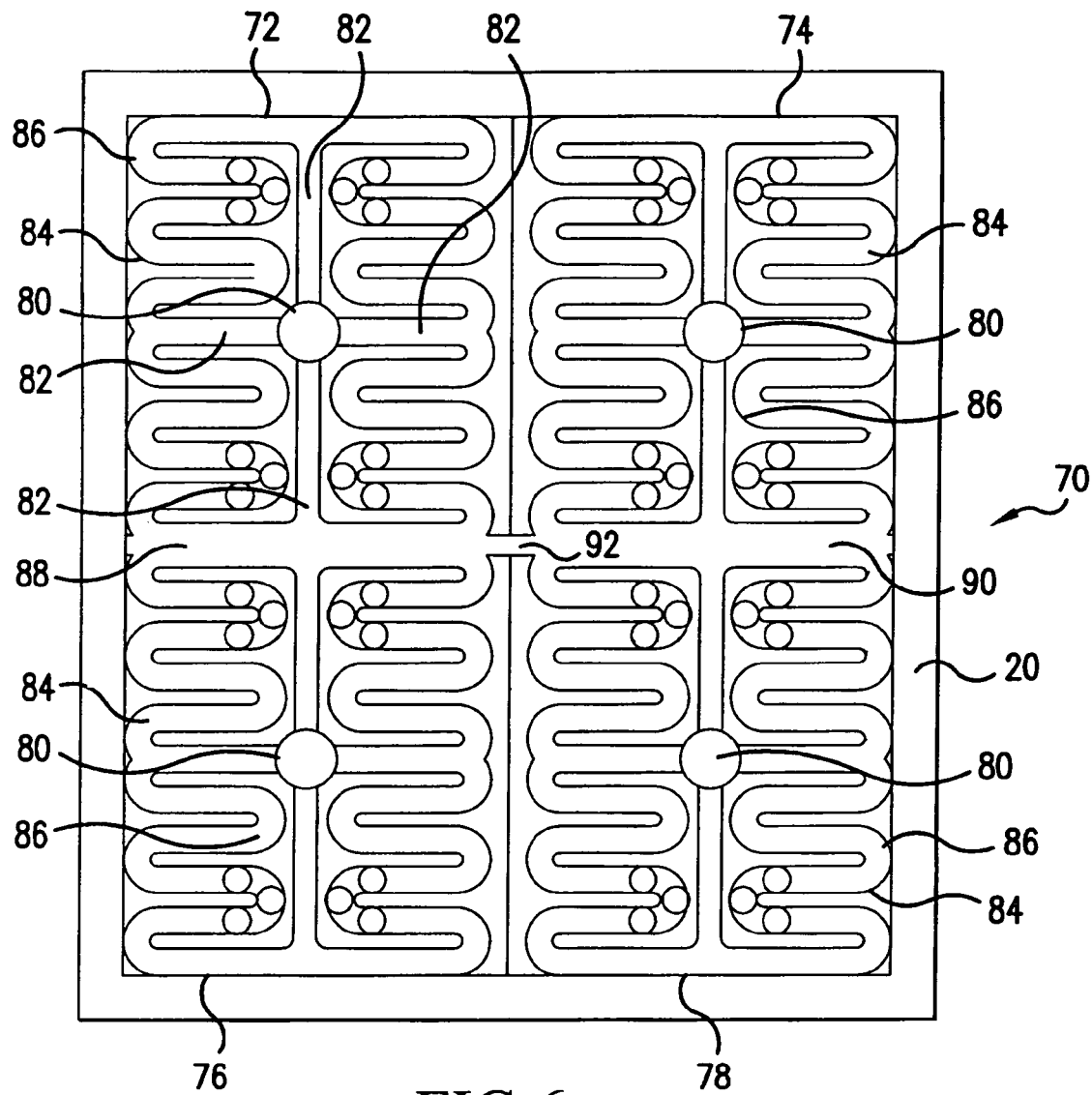
FIG. 6 is a top plan view of an entrance plate according to a second embodiment of the present invention.

A second entrance plate 70, for use in a gas preheater, having first through fourth entrance plate portions 72, 74, 76 and 78 is illustrated in FIG. 6. While not illustrated in this Figure, a diffuser plate 40, blocking plates 50 and an exit plate 60 are mounted on second entrance plate 70 as described above in connection with a gas preheater using the first entrance plate 12.

Entrance plate 70 includes four openings 80 from which a gas enters first through four linear passages 82. In this embodiment, each entrance plate portion 72, 74, 76 and 78 includes a plurality of circuitous passages 84 having radiused turns 86 which may affect the resistance to flow presented by a preheater in which this entrance plate 70 is used. A first chamber 88 connects first entrance plate portion 72 and third entrance plate portion 76 while a second chamber 90 connects second entrance plate portion 74 and fourth entrance plate portion 78 A connecting passage 92 connects first chamber 88 to second chamber 90. In this manner, the first, second, third and fourth entrance plate portions 72, 74, 76 and 78 are in fluid communication with one another thereby allowing for balancing of pressure differences among the entrance plate portions. Second entrance plate 70 may also be manufactured using a different process by which the circuitous, radiused pathways formed as opposed to the linear walls 19 of the first embodiment. Gas preheaters using second entrance plate 70 instead of first entrance plate 12 will function in substantially the same manner as gas preheaters using first entrance plate 12 discussed above.

The present invention has been described in terms of several embodiments. However, obvious modifications and additions to these embodiments will become apparent to those skilled in the relevant arts upon a reading of the foregoing description. It is intended that all such obvious modifications and additions form a part of the present invention to the extent they fall within the scope of the several claims appended hereto.

We claim:

1. A gas preheater comprising:
   an entrance plate having a first side, a second side, at least one opening connecting said first side and said second side, and a plurality of walls on said second side having tops spaced from said second side, said walls defining at least one circuitous pathway on said second side beginning at said at least one opening; and
   a diffuser plate having a first side and a second side and a plurality of holes between said first side and said second side, said diffuser plate first side defining with said entrance plate second side and said plurality of walls at least one circuitous passage along said at least one circuitous pathway;
   said at least one circuitous passage having a first portion leading from said at least one opening and a second portion spaced from said at least one opening,
   wherein said holes in said diffuser plate overlie said circuitous passage second portion; and
   said diffuser plate contacts said tops of said plurality of walls to limit gas flow between said tops and said diffuser plate.

2. The gas preheater of claim 1 wherein no holes in said diffuser plate overlie said circuitous passage first portion.

3. The gas preheater of claim 2 including a sidewall on said entrance plate and including an exit plate over said diffuser plate, said exit plate having a first side, a second side and a plurality of openings connecting said first side and said second side.

4. The gas preheater of claim 1 wherein said diffuser plate is supported by said plurality of walls.

5. The gas preheater of claim 1 including a plurality of blocking plates resting on said diffuser plate second side and at least partially overlying some of said holes.

6. The gas preheater of claim 5 including an exit plate having a first side, a second side and a plurality of openings connecting said first side and said second side, said exit plate supported by said blocking plates.

7. The gas preheater of claim 1 wherein said entrance plate at least one opening comprises first and second openings, said at least one circuitous passage comprises a first circuitous passage including said first opening and a second circuitous passage including said second opening, wherein said first and second circuitous passages are in fluid communication with one another.

8. The gas preheater of claim 1 wherein said circuitous passage includes radiused wall portions.

9. The gas preheater of claim 1 wherein said at least one circuitous passage has a serpentine portion.

10. A gas preheater comprising:
    an entrance plate comprising first, second, third and fourth entrance plate portions, each of said first, second, third and fourth entrance plate portions having a first side, a second side, an opening connecting said first side and said second side, and a plurality of walls on said second side having tops spaced from said second side and defining at least one circuitous pathway on said second side beginning at said opening; and
    a diffuser plate having a first side and a second side and a plurality of holes between said first side and said second side resting on the tops of said walls;
    said diffuser plate first side defining with said entrance plate portion second sides and said walls a plurality of circuitous passages leading from said openings in said first, second, third and fourth entrance plate portions,
    said diffuser plate holes overlying predetermined portions of said circuitous passageways, the location of said holes selected to provide a predetermined minimum travel distance between said first, second, third and fourth entrance plate portion openings and said diffuser plate holes.

11. The gas preheater of claim 10 wherein said first, second, third and fourth entrance plate portions are integrally formed.

12. The gas preheater of claim 10 wherein said plurality of passages comprise a plurality of circuitous passages leading from each of the openings in said first, second, third and fourth entrance plate portions.

13. The gas preheater of claim 12 wherein a first one of said plurality of circuitous passages is in fluid communication with a second one of said plurality of circuitous passages.

14. The gas preheater of claim 12 wherein all said circuitous passages are in mutual fluid communication.

15. The gas preheater of claim 12 including first and second linear passages extending from said opening of each of said first, second, third and fourth entrance plate portions.

16. The gas preheater of claim 10 including a plurality of blocking plates arranged on the second side of said diffuser plate and an exit plate supported above said diffuser plate.

17. The gas preheater of claim 10 wherein said plurality of circuitous passages includes radiused wall portions.

18. The gas preheater of claim 10 wherein said plurality of circuitous passages each comprise a linear first portion and at least two 180 degree turns.

19. A gas preheater comprising:
   an entrance plate comprising first, second, third and fourth entrance plate portions, each of said entrance plate portions having a first side, a second side, an opening connecting said first side and said second side, and a plurality of walls on said second side having tops spaced from said second side and defining at least two circuitous pathways having serpentine portions on said second side beginning at said opening;
   a diffuser plate having a first side resting on said walls and a second side and a plurality of holes between said first side and said second side, said diffuser plate first side defining with said entrance plate portion second sides and said walls a plurality of circuitous passages leading from said openings in said first, second, third and fourth entrance plate portions, said diffuser plate holes overlying predetermined portions of said circuitous passageways, the location of said holes selected to provide a predetermined minimum travel distance between said entrance plate portion openings and said diffuser plate holes;
   a plurality of blocking plates resting on said diffuser plate second side and at least partially covering some of said holes; and
   an exit plate having a plurality of holes supported above said diffuser plate.

* * * * *